US010879908B2

(12) United States Patent
Zhodzishsky et al.

(10) Patent No.: US 10,879,908 B2
(45) Date of Patent: Dec. 29, 2020

(54) METHOD AND SYSTEM FOR MEASURING G-SENSITIVITY OF QUARTZ OSCILLATORS

(71) Applicant: Topcon Positioning Systems, Inc., Livermore, CA (US)

(72) Inventors: Mark Isaakovich Zhodzishsky, Moscow (RU); Vladimir Victorovich Beloglazov, Moscow (RU); Danila Svyatoslavovich Milyutin, Moscow (RU); Roman Valerievich Kurynin, Moscow (RU); Vadim Borisovish Kuzmitchev, Moscow (RU); Sergey Viktorovich Rogachkov, Moscow (RU)

(73) Assignee: Topcon Positioning Systems, Inc., Livermore, CA (US)

( * ) Notice: Subject to any disclaimer, the term of this patent is extended or adjusted under 35 U.S.C. 154(b) by 0 days.

(21) Appl. No.: 16/616,591

(22) PCT Filed: Mar. 29, 2019

(86) PCT No.: PCT/RU2019/000202
§ 371 (c)(1),
(2) Date: Nov. 25, 2019

(87) PCT Pub. No.: WO2020/204740
PCT Pub. Date: Oct. 8, 2020

(65) Prior Publication Data
US 2020/0313676 A1    Oct. 1, 2020

(51) Int. Cl.
*H03L 1/00* (2006.01)
*G01P 15/18* (2013.01)
(Continued)

(52) U.S. Cl.
CPC ............ *H03L 1/00* (2013.01); *G01P 15/03* (2013.01); *G01P 15/18* (2013.01); *H03B 5/04* (2013.01)

(58) Field of Classification Search
CPC .......................................... H03L 1/00
(Continued)

(56) References Cited

U.S. PATENT DOCUMENTS 8,618,981 B2   12/2013   Zhodzishsky et al.
9,618,626 B2    4/2017   Veitsel et al.
(Continued)

FOREIGN PATENT DOCUMENTS

RU       2381616 C2    2/2010

OTHER PUBLICATIONS

International Search Report and Written Opinion dated Dec. 12, 2019, in connection with International Patent Application No. PCT/RU2019/000202, 7 pgs.
(Continued)

*Primary Examiner* — Joseph Chang
(74) *Attorney, Agent, or Firm* — Chiesa Shahinian & Giantomasi PC

(57) ABSTRACT

A method and system are provided for estimating the g-sensitivity of a quartz oscillator, which includes rotating the quartz oscillator successively around each of a plurality of axes constituting a full-rank system, measuring a frequency of the quartz oscillator at a predetermined rate as a function of time during rotation, and estimating an integral g-sensitivity vector while the quartz oscillator is rotated. Estimation can be performed utilizing a data fitting and estimation model, e.g., a Least Square Method (LSM) in one example, using the frequency measurements obtained while the quartz oscillator is in rotation around the axes. The method and system are especially useful for measuring g-sensitivity of quartz oscillators that are incorporated in high-precision systems, such as navigation receivers, which operate in environments that are subjected to vibrational effects and other mechanical forces.

32 Claims, 6 Drawing Sheets

(51) Int. Cl.
*H03B 5/04* (2006.01)
*G01P 15/03* (2006.01)

(58) Field of Classification Search
USPC .................................................... 331/116 R
See application file for complete search history.

(56) References Cited

U.S. PATENT DOCUMENTS

| | | |
|---|---|---|
| 10,031,236 B2 | 7/2018 | Zhodzishsky et al. |
| 2010/0199744 A1* | 8/2010 | Chan ........................ G01P 15/18 73/1.38 |
| 2011/0077889 A1* | 3/2011 | Vogt ........................ G01C 17/38 702/93 |
| 2012/0223785 A1 | 9/2012 | Fry et al. |
| 2018/0109263 A1 | 4/2018 | Wanner |

OTHER PUBLICATIONS

Morley et al., "Method Measurement of the Sensitivity of Crystal Resonators to Repetitive Stimuli," 6 pgs.
Kurynin et al., "Method for assessing the G-sensitivity of crystal oscillators in GNSS receivers," May 2019, 9 pgs.
Przyjemski et al., "Limitations on GPS Receiver Performance Imposed by Crystal-Oscillator g-Sensitivity," NAECON 77, Proceedings of the IEEE 1977 National Aerospace and Electronics Conference, Dayton, 1977, pp. 319-322.

* cited by examiner

METHOD AND SYSTEM FOR MEASURING G-SENSITIVITY OF QUARTZ OSCILLATORS

CROSS-REFERENCE TO RELATED APPLICATIONS

This application is a National Stage under 35 U.S.C. 371 of PCT/RU2019/000202, filed Mar. 29, 2019, the entire content of which is incorporated herein by reference.

TECHNICAL FIELD

The present invention relates generally to the testing of components and systems employing quartz oscillators, and more particularly to measuring sensitivity to acceleration effects on quartz oscillators utilized in navigation systems and the like.

BACKGROUND

Quartz oscillators are used in many different devices, systems and applications that require a stable frequency reference including computers, communications, radio-location, and navigation, by way of example. Quartz oscillators typically provide the requisite frequency stability and can be a more cost-effective alternative as compared to atomic, rubidium and other frequency references.

A key performance metric for oscillators is frequency stability in the presence of environmentally-induced effects, some of which can lead to significant performance degradation in devices and systems that incorporate oscillators. For example, frequency stability is a critical design parameter for oscillators used in navigation systems in which accuracy is of paramount importance. Navigation systems are susceptible to degraded performance as a result of environmental conditions and, as such, any compromise in the quality and performance of the oscillators used as frequency references can have detrimental effects on the accuracy of the navigation systems. Expectations for product performance continue to rise, which in turn has resulted in system specifications with increasing performance requirements on individual components, such as oscillators.

Various factors can negatively affect the frequency stability of a quartz oscillator, with such effects typically manifested as undesirable frequency shifts. For example, such frequency shifts may be caused by conditions such as: temperature changes (e.g., changes in ambient temperature and/or heat transfer effects on elements within the oscillator); humidity; pressure; changes in supply voltage or load; the presence of external electromagnetic fields; or the aging of components.

Oscillators are also known to be very sensitive to accelerations resulting from shock, rotation, vibrations, movements and inclinations. Such conditions can be particularly problematic for applications that require high-precision oscillators, such as navigation systems. For example, navigation systems are now used extensively in the operation of heavy equipment and machinery for construction and agricultural applications (e.g., "moving machines"). For example, operating equipment may include an on-board navigation receiver to facilitate precision-guided excavation, road repair, crop harvesting or any number of other tasks. Given the nature of the service conditions in these applications, shock and vibration-induced effects can detrimentally affect the precision of navigation receivers that utilize quartz oscillators. For example, during operation, a navigation receiver installed on a moving machine may be subjected to disturbances such as shaking during movement, as well as jolts, shocks or vibrations from the actions of the working assemblies on the machines. Although various techniques may be employed in equipment and systems to mitigate or correct for these effects, better test and measurement methods are still needed prior to placing such equipment into service.

Ensuring quartz oscillators meet the necessary standards of performance requires accurate and reliable testing and verification techniques to measure frequency and vibrational stability, and in particular, an oscillator's sensitivity to acceleration. The estimate of the stability of a quartz oscillator in response to acceleration effects is referred to as g-sensitivity, which is defined as the relative change in the output frequency of an oscillator at an acceleration of one g applied to an oscillator, where g is the acceleration of gravity on the surface of the earth at sea level (approximately equal to 9.81 m/s$^2$).

The g-sensitivity of an oscillator can be measured during the manufacturing process of an oscillator and various, well-known techniques have been used by oscillator manufacturers for this purpose. However, testing and verification procedures become more complicated once oscillators are integrated onto circuit boards and further integrated into systems such as navigation receivers and the like. For example, measuring g-sensitivity of a quartz oscillator that is mounted on a circuit board, but which is not inside an equipment housing, introduces thermal effects that can affect g-sensitivity estimates. Furthermore, quartz oscillators are mass-produced, giving rise to quality control concerns given the wide range of performance requirements and operating conditions in which these devices are employed. As might be expected, those who make or use navigation systems for commercial and industrial applications, which are subject to more extreme vibrational and other environmental conditions, cannot necessarily rely on testing that is performed by oscillator device manufacturers who are serving the broad spectrum of device applications.

Various methods are used to test and measure g-sensitivity in quartz oscillators. These methods are classified as either static or dynamic. In static testing, the quartz crystal is maintained in a stationary position (i.e., static position) along one axis for a predetermined period of time during which gravity acceleration affecting the crystal is not changed. The position of the crystal is then changed (e.g., typically turned 180°), and the crystal is maintained in this subsequent position the same predetermined period of time as the first instance. Despite the evident simplicity, static testing has several drawbacks, one example being deficiencies in measuring and/or accounting for temperature drift of an oscillator's frequency, which can be a significant consideration for practical applications and operations. In dynamic testing, different apparatuses and test setups can be used (e.g., vibration benches, etc.) to provide the necessary accelerations while testing. Using vibration benches, for example, harmonic and random vibrations at different frequencies and strengths can be created. However, vibration benches and other dynamic test setups can be quite expensive and may require rigorous control of specific conditions for the setup and conduct of tests

SUMMARY

An improved testing method is needed to measure g-sensitivity of quartz oscillators that are incorporated in high-precision systems, such as navigation receivers, which operate in environments that are subjected to vibrational effects and other mechanical forces. Embodiments described herein include a method and system for measuring the g-sensitivity of quartz oscillators in a manner that overcomes the issues and challenges of conventional test methods.

According to one embodiment, a method for estimating the g-sensitivity of a quartz oscillator comprises rotating the quartz oscillator successively around each of a plurality of axes constituting a full-rank system, measuring a frequency of the quartz oscillator at a predetermined rate as a function of time as the quartz oscillator is rotated, and estimating an integral g-sensitivity vector, while the quartz oscillator is rotated, using a data fitting and estimation model, e.g., a Least Square Method (LSM) in one example, using the plurality of frequency measurements obtained while the quartz oscillator was in rotation around the three orthogonal axes.

According to an embodiment, the plurality of axes in the full-rank system comprises three orthogonal axes including an x-axis, a y-axis and a z-axis. In one example, rotations around the x-axis, y-axis, z-axis are performed at a substantially constant angular velocity.

According to an embodiment, the frequency of the quartz oscillator is measured to derive a frequency estimate used to obtain a relative deviation of the frequency of the quartz oscillator, relative to its nominal frequency, as it is rotated around the three orthogonal axes, wherein the relative deviation is represented in parts per billion (ppb) units.

According to one embodiment, the constant angular velocity can be a value in the range of approximately 0.3 to 1 turn per second and the predetermined rate of measuring frequency can be a value of approximately greater than or equal to 10 Hz.

In one embodiment, to facilitate the estimate of the integral g-sensitivity vector, frequency measurements from rotation of the quartz oscillator are represented as a function of relative frequency deviations, angular velocity, time-dependent terms representing thermal frequency variations, and projections of orthogonal harmonic components of the oscillator's frequency onto respective planes that are orthogonal to the respective axes of rotation.

In another embodiment, a system is provided that includes a processor, for executing computer program instructions stored in a memory, to perform operations for estimating the g-sensitivity of a quartz oscillator. The operations include rotating the quartz oscillator, in cooperation with a test adapter unit configured to receive the quartz oscillator for testing, at a substantially constant angular velocity successively around each of three orthogonal axes, measuring a frequency of the quartz oscillator at a predetermined rate as a function of time during the rotating of the quartz oscillator, and estimating an integral g-sensitivity vector, during the rotating of the quartz oscillator, using a data fitting and estimation model and a plurality of frequency measurements obtained from the measuring of the frequency of the quartz oscillator.

In another embodiment, the relative deviation of the frequency of the quartz oscillator can measured when the quartz oscillator is fixed in position on a Global Navigation Satellite System (GNSS) receiver board, taking into account a derivative offset variable, based on clock offset and drift rate relative to GNSS system time.

DETAILED DESCRIPTION

Figure 1:
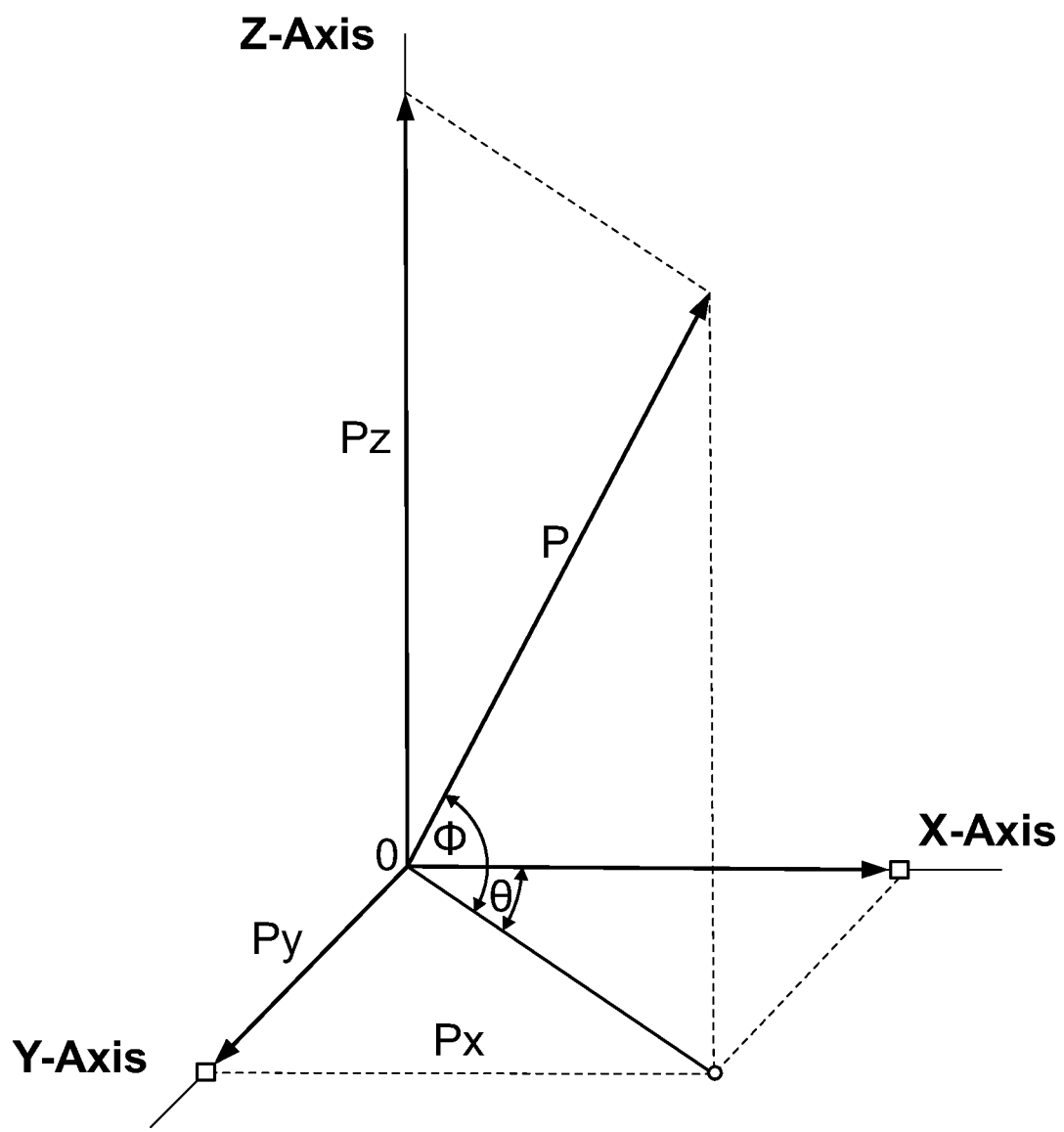
FIG. 1 shows a three-dimensional representation of a g-sensitivity vector.

Various illustrative embodiments will now be described more fully with reference to the accompanying drawings in which some of the illustrative embodiments are shown. It should be understood, however, that there is no intent to limit illustrative embodiments to the particular forms disclosed, but on the contrary, illustrative embodiments are intended to cover all modifications, equivalents, and alternatives falling within the scope of the claims. Like numbers refer to like elements throughout the description of the figures. It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of illustrative embodiments. As used herein, the term "and/or" includes any and all combinations of one or more of the associated listed items.

An improved testing method is needed to measure g-sensitivity of quartz oscillators that are incorporated in high-precision systems, such as navigation receivers, which operate in environments that are subjected to vibrational effects and other mechanical forces. Embodiments described herein include a method and system for measuring the g-sensitivity of quartz oscillators in a manner that overcomes the issues and challenges of conventional test methods.

As described, the estimate of the stability of a quartz oscillator in response to acceleration effects is referred to as g-sensitivity, which is defined as the relative change in the output frequency of an oscillator at an acceleration of one g (1 g) applied to an oscillator, where g is the acceleration of gravity on the surface of the earth at sea level (approximately equal to 9.81 m/s$^2$). Generally, for different oscillator types, relative frequency shifts depend on their configuration and can range from $10^{-8}$ to $10^{-10}$. It is often expressed in terms of ppb/g (parts per billion/g). A unit of ppb/g corresponds to a change in relative frequency by $10^{-9}$ at an acceleration equal to 1 g. G-sensitivity is represented as a vector because it depends on both its value (magnitude) and the direction of acceleration.

A measure of g-sensitivity shows the sensitivity of the quartz oscillator to acceleration along a plurality of axes in a full-rank system, such as three orthogonal axes (e.g., x-axis, y-axis, z-axis), the direction of which can be determined in different ways. For example, manufacturers of quartz oscillators normally measure g-sensitivity by directing axes x, y and z along the quartz crystal axes. However, this method is not practical for measuring g-sensitivity of a quartz oscillator that has already been incorporated inside a housing of a device "hiding" its axes. It is thus more practical to test and measure g-sensitivity by orienting the axes relative to the geometrical features of the assembling board onto which the quartz oscillator is installed. In this manner, one can more readily ascertain along which axis the board exhibits the greatest amount of vibration sensitivity, the least amount, and so on.

FIG. 1 shows the projections of g-sensitivity vector P on axes x, y and z. As shown, the absolute value of the g-sensitivity vector P is normally directed at an angle to the axes and therefore does not coincide with a normal to an axis. The value of g-sensitivity vector P can be calculated based on orthogonal components $P_x$, $P_y$ and $P_z$ as follows:

$$P = \sqrt{P_x^2 + P_y^2 + P_z^2} \qquad \text{(Equation 1)}$$

$$\theta = \arctan\left(\frac{P_y}{P_x}\right) \qquad \text{(Equation 2)}$$

$$\Phi = \arcsin\left(\frac{P_z}{P}\right) \qquad \text{(Equation 3)}$$

If the value and orientation angle of the quartz oscillator are known relative to a device comprising a quartz oscillator (e.g., a navigation receiver), wherein the device is fixed to a source of vibration (e.g., tractor, bulldozer, etc.), then the direction of most intense vibrations can predict the effect of the acting accelerations.

A further description of static and dynamic testing of g-sensitivity in quartz oscillators will now be provided.

Static Testing. One of the most common and conceptually simple static test methods is commonly referred to as the "2 g Tipover" test, which is essentially using changes in the earth's gravitational field to cause shifts in the oscillator frequency. The "2 g Tipover" name is derived from the fact that frequency change is measured as the unit under test is effectively turned upside-down. That is, the unit is turned around the horizontal axis (e.g., by 180 degrees) such that the scalar multiplication product of acceleration and the normal vector to the original resonator's tip changes from −1 g to +1 g, the net effect being a change (difference) of 2 g. Therefore, the amount of measured frequency shift divided by 2 represents the oscillator's g-sensitivity in that axis. The procedure is then repeated for the other two axes.

Figure 2:
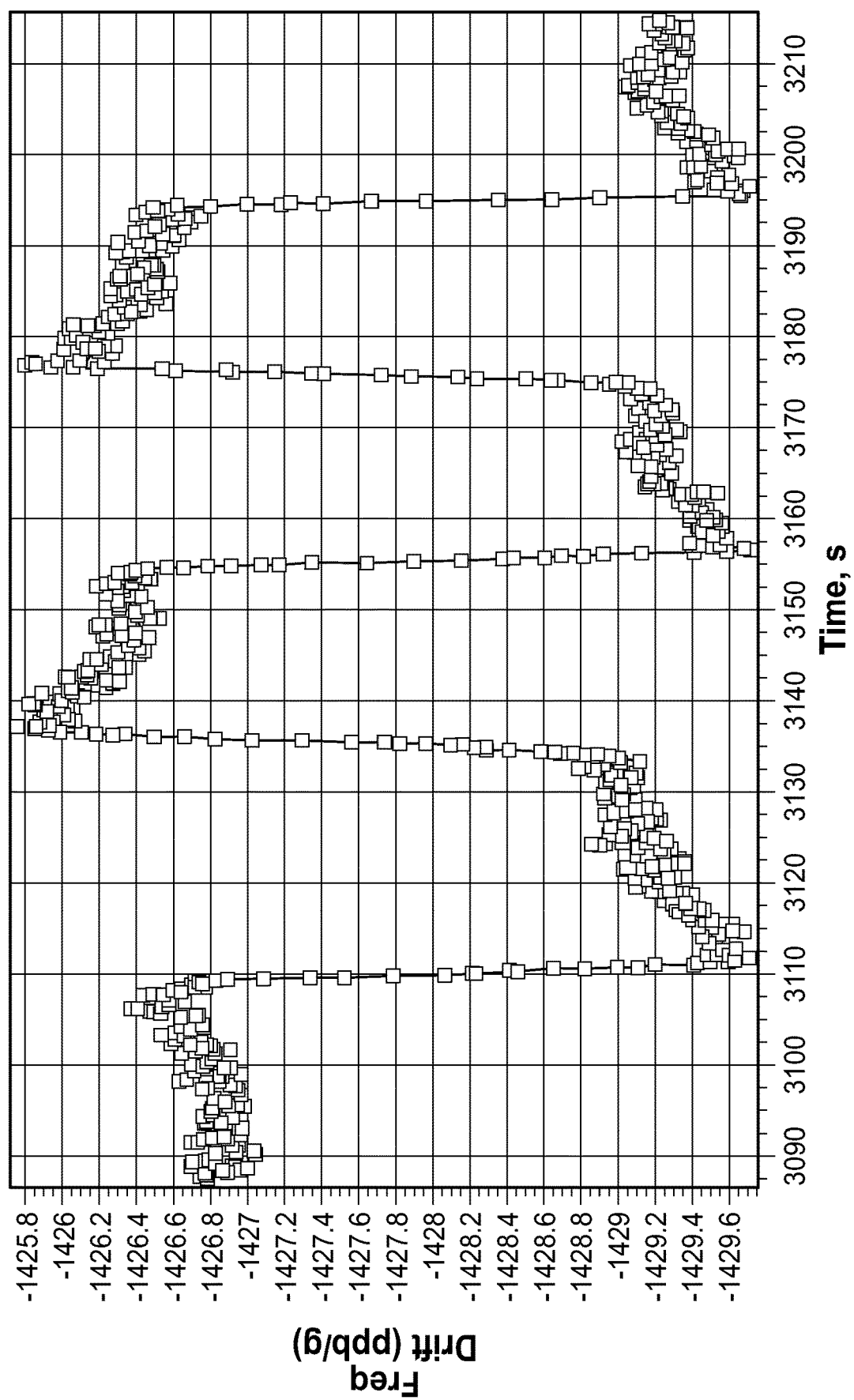
FIG. 2 shows a graphical plot corresponding to a conventional static testing method.

As indicated, this method of static testing has a considerable disadvantage with regard to measuring or accounting for a temperature drift of oscillator's frequency, which is particularly relevant when testing quartz oscillators on assembled boards without placing them in a device housing. Thus, testing by an oscillator manufacturer does not have the same complexities as those who must test oscillators that have already been installed on assembly boards and/or integrated into devices such as navigation receivers. In these latter scenarios, an oscillator's temperature mode changes due to re-orientation of the board, resulting in a temperature frequency drift as shown in FIG. 2. In particular, FIG. 2 is a plot showing the drift of relative frequency in ppb/g units as a function of time during the process of re-orientation of an oscillator in 180° around one axis, with the relative frequency drift represented in units $$ppb/g = \frac{\Delta f}{f_q} \cdot 10^9,$$

i.e., the ratio of frequency deviation to the nominal frequency of the oscillator multiplied by $10^9$. The measurements in FIG. 2 were taken for a typical quartz oscillator used in navigation receivers. In particular, the measurements were obtained for a quartz oscillator arranged on navigation receiver's assembly board without the housing. As shown in FIG. 2, there are meander oscillations of the oscillator's frequency due to sign reversals of the gravity acceleration (g) from the re-orientation of the board by 180 degrees in the vertical plane. Moreover, when the assembly board is fixed, there is a temperature drift (e.g., thermal trend) from the overlaid noise component caused by oscillator frequency alternations (e.g., the so-called "flicker effect"), which reduces the accuracy of estimating the g-sensitivity of the oscillator.

Figure 3:
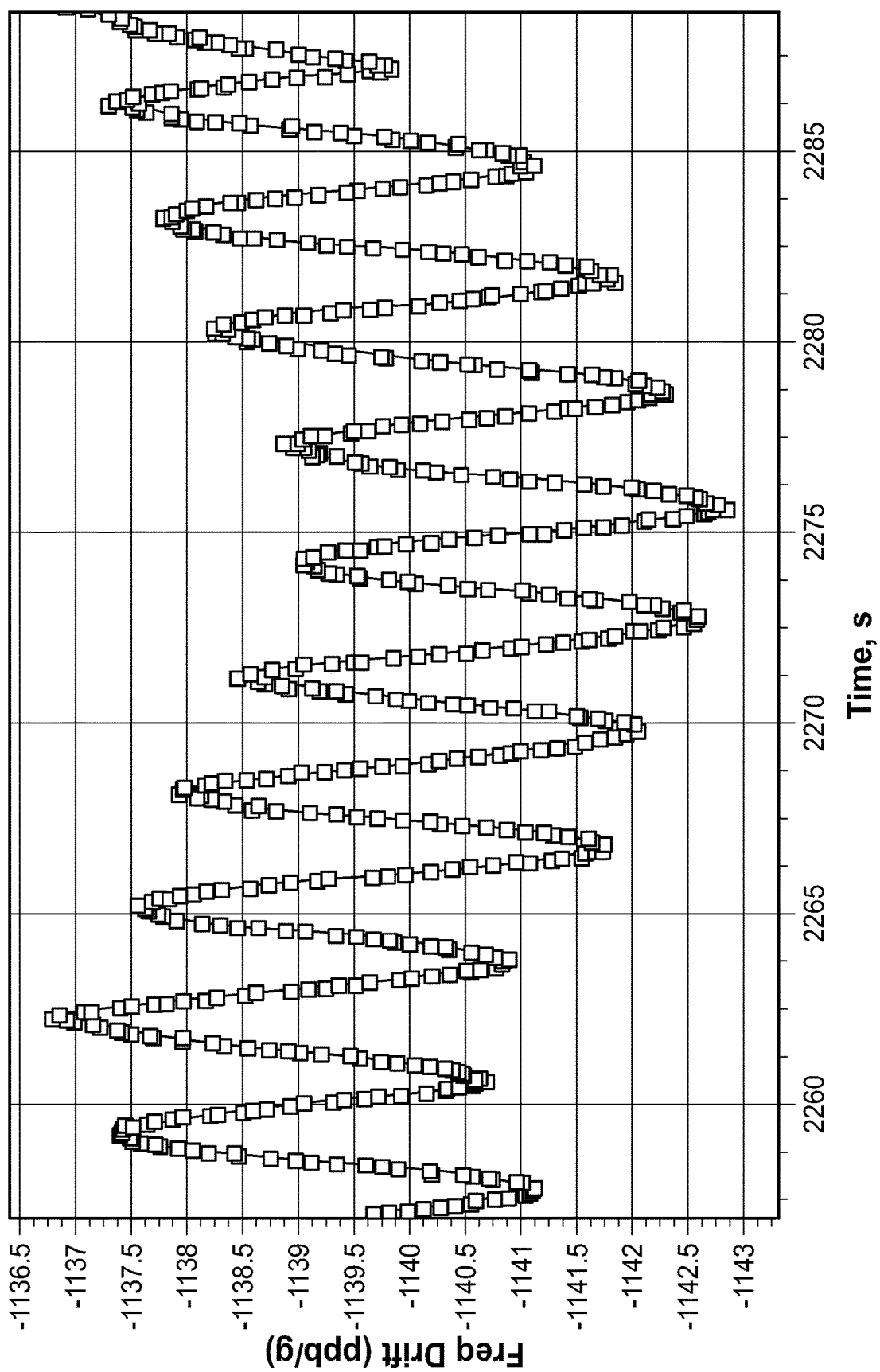
FIG. 3 shows a graphical plot corresponding to a conventional dynamic testing method.

Dynamic testing. Generally, dynamic testing methods obtain measurements of g-sensitivity by influencing continuously-varied accelerations on a quartz oscillator along a tested axis. As indicated, vibration benches, are commonly used to apply both sinusoidal and wide-band random vibrations to the oscillator. There are also dynamic methods that do not utilize vibration benches, where g-sensitivity is determined based on the acceleration of gravity. For example, if meander re-orientations around the axis used in the static method (see FIG. 2) are replaced with rotation around the same axis (and the oscillator's axes positions are recorded), then one can estimate g-sensitivity in this axis. This method requires rotation of the oscillator around two axes at a certain speed with further indication (e.g., recordation) of the oscillator's axes positions at each time moment. FIG. 3 is a plot showing the relative frequency drift in ppb/g units as a function of time during the process of rotating the oscillator around one of its axes. Among other disadvantages, the device for implementing rotation in the test configuration is more complicated because of the requirement to indicate positions of axes in motion (e.g., at each time instant). In another dynamic method not requiring a vibration stand, gravity acceleration can be applied to an oscillator under test that is kept in motion according to known rotation scenarios/techniques capable of providing an observable three-dimensional model for estimating the three-dimensional g-sensitivity vector of the quartz crystal. However, these scenarios/techniques typically require expensive equipment and more complex implementations.

In view of the aforementioned shortcomings of the conventional test methods, embodiments of the invention described herein provide a test method that is capable of estimating vibration characteristics of a quartz oscillator without requiring the indication of axes positions at each time instant.

Figure 4:
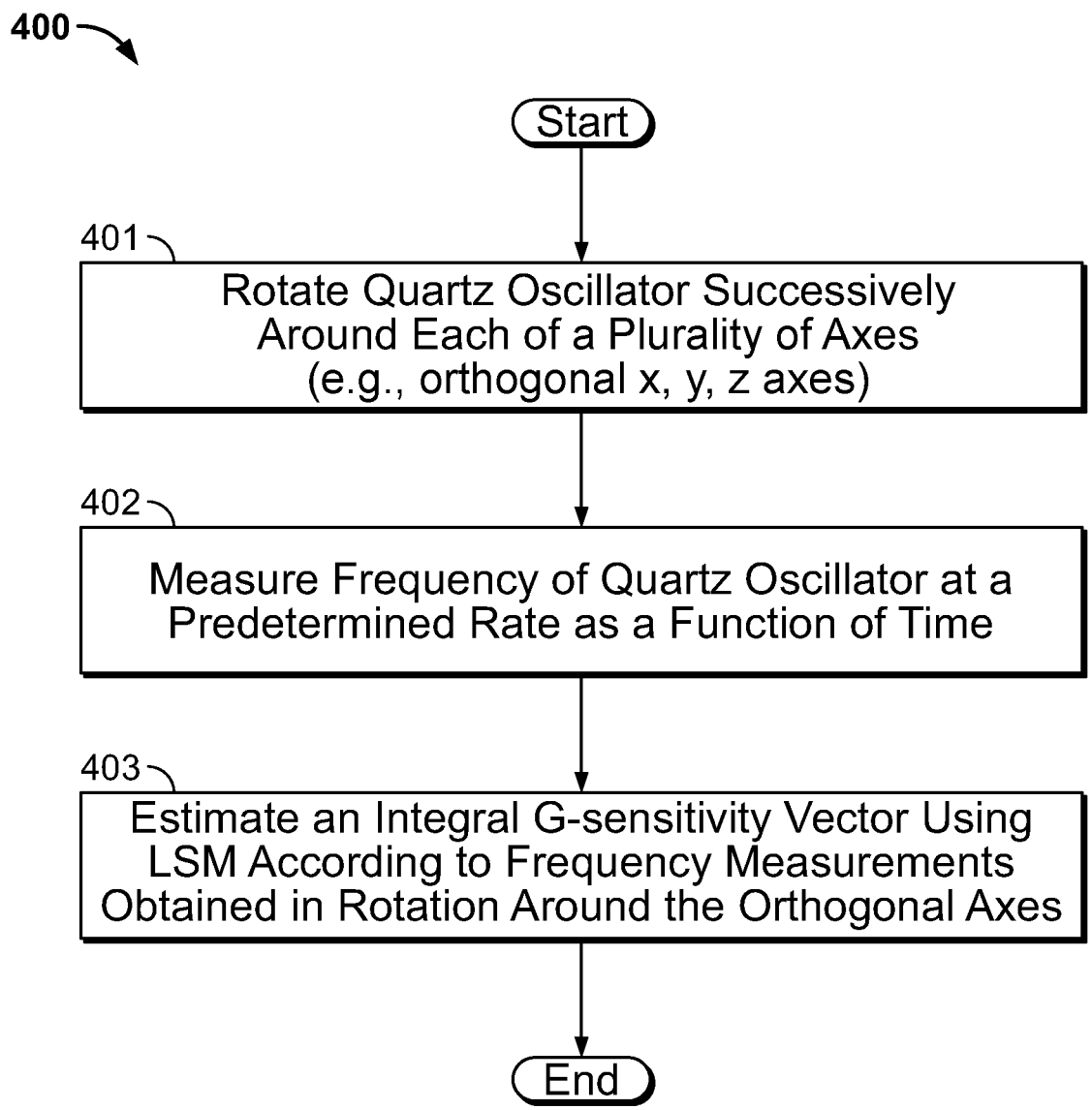
FIG. 4 shows a flowchart showing a method according to an illustrative embodiment of the invention.

In particular, FIG. 4 shows a simplified flowchart depicting method 400 according to an illustrative embodiment for estimating the g-sensitivity of a quartz oscillator. As shown in step 401, the quartz oscillator is rotated successively around each of a plurality of axes in a full-rank system. In one illustrative embodiment, the full-rank system can have a rank equal to 3 and comprise three orthogonal axes (e.g., x, y and z axes). In step 402, the frequency of the quartz oscillator is measured at a predetermined rate as a function of time as the quartz oscillator is rotated, but without indicating axis positions at each time instant. In step 403, an integral g-sensitivity vector is estimated, in one example, using a Least Square Method (LSM) according to frequency measurements obtained in rotation around the three orthogonal axes. Importantly, at the same time while the quartz oscillator is rotated around each of the axes, the projection of the frequency integral vector P to the respective plane that is orthogonal to the respective axis of rotation is estimated (see FIG. 6), where vector P characterizes the g-sensitivity of the quartz oscillator.

As will be appreciated by those skilled in the art, a non-trivial rotation scenario for rotating the quartz oscillator in prior arrangements typically requires more complex and expensive equipment. According to the embodiments herein, various rotation scenarios can be employed and are contemplated by these teachings. For example, the quartz oscillator can be rotated according to known rotation scenarios, but successively around each of a plurality of axes (e.g., linearly independent axes) that collectively form or otherwise constitute a full-rank system. In another illustrative embodiment, the quartz oscillator is rotated at a substantially constant angular velocity. In one example, the constant angular velocity can be set at a value in the range of 0.3 to 1 turn per second while the predetermined rate of measuring frequency is set at a value of no less than 10 Hz. In another embodiment, the predetermined rate of measuring frequency may be set to be no less than 20 Hz. However, these values and ranges are only meant to be illustrative and not limiting in any manner. Other values and combinations of values for constant angular velocity and/or the measuring frequency rate are contemplated by the teachings herein. For example, rotation about the axes can be at a higher angular velocity, e.g., greater than 1 turn per second, but other factors (e.g., centripetal acceleration, etc.) may have to be considered as will be apparent to one skilled in the art. Test equipment may also need to be modified and/or augmented to support rotation at higher angular velocities. Conversely, lower angular velocities (e.g., less than 0.3 turns per second) may be possible in some scenarios, but other factors may need to be considered as will now be described (e.g., in the context of thermal noise in one example). According to an aspect of the invention, estimating the integral frequency shift parameter (e.g., ppb/g parameter) is done taking into account the disturbing effects from thermal frequency variations. For example, the choice of a value for constant angular velocity is based on the following considerations. The spectrum of thermal noise lies within a certain finite band. The constant angular velocity must be distinguishable from the spectrum of thermal noise, e.g., it should be much higher. On the other hand, the rate of measuring frequency must distinguish rotation terms and thus should be, for example, at least 2 times higher than the constant angular velocity, due to the Nyquist-Shannon sampling theorem.

Figure 5:
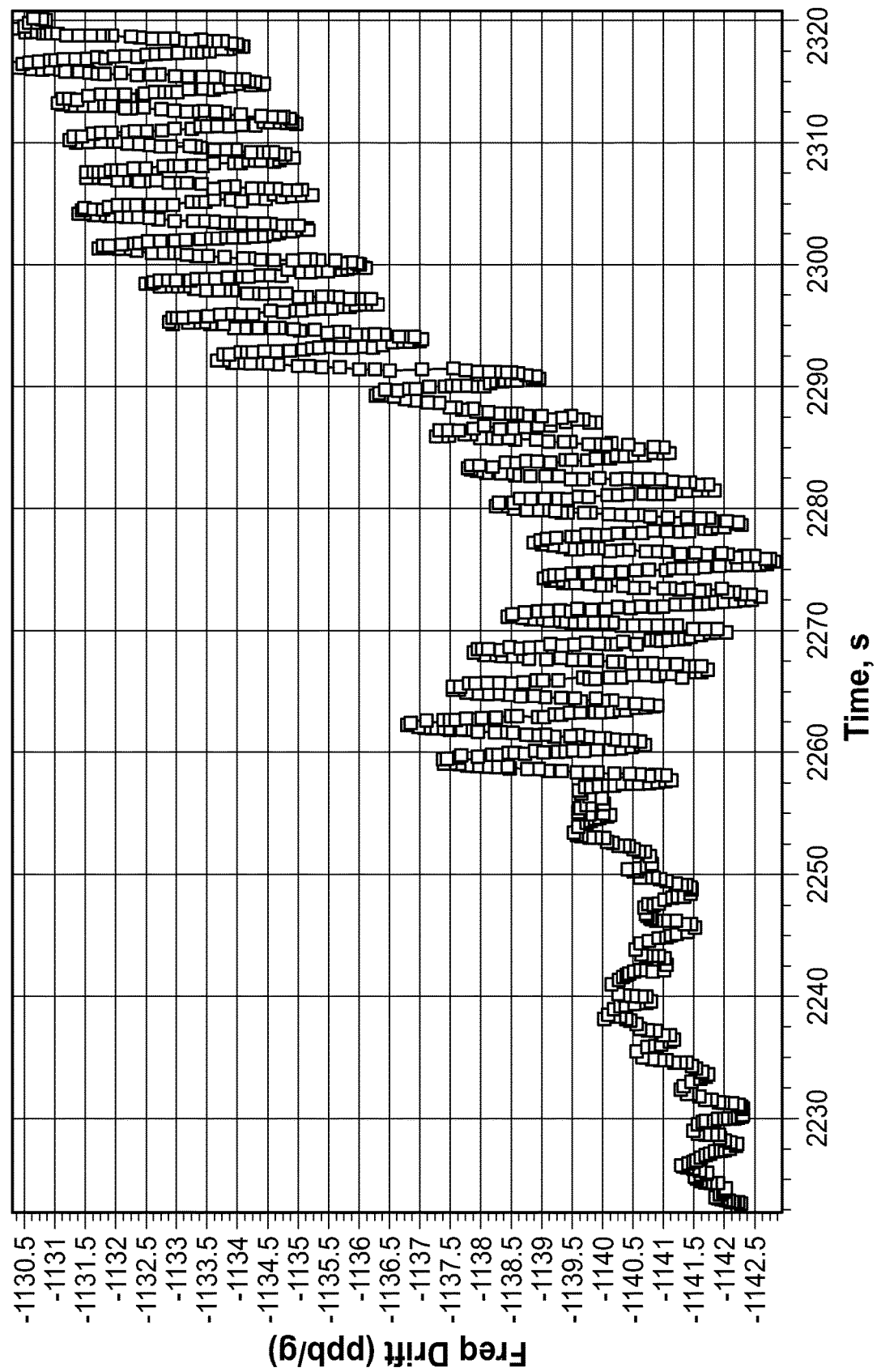
FIG. 5 shows a graphical plot showing frequency measurements according to an illustrative embodiment of the invention.

FIG. 5 is a plot showing the drift of relative frequency in successive rotations of an oscillator around axes x, y and z measured according to an illustrative embodiment of the invention. In particular, FIG. 5 shows the relative deviation of the oscillator's frequency (e.g., the ratio of frequency deviation to the nominal frequency multiplied by $10^9$) in rotating successively around axes x, y and z. In FIG. 5, measurements up to approximately 2255 seconds correspond with the rotation around axis x, measurements after approximately 2255 seconds and up to approximately 2290 seconds correspond to rotation around axis y, and measurements after approximately 2290 seconds and up to approximately 2320 seconds correspond to rotation around axis z.

For the operation that follows, $y_i^x$ designates results of oscillation frequency in rotation around the x-axis, $y_i^y$ designates results in rotation around the y-axis, and $y_i^z$ designates results in rotation around the z-axis. The expression for $y_i^x$ is provided below, with the expressions for $y_i^y$ and $y_i^x$ derived and represented in a similar manner, e.g., with appropriate substitution of the corresponding variables pertaining to the respective rotations around axes y and z (e.g., $C^y$ or $C^z$ instead of $C^x$, and so on). From the above noted frequency measurements shown in FIG. 5 for rotations around the x, y and z axes, the following operation can be represented, in general:

$$y_i^x = C^x \cdot \cos(\phi^x(i \cdot T)) + S^x \cdot \sin(\phi^x(i \cdot T)) + B^x(i \cdot T) + n_i^x, \quad \text{(Equation 4)}$$

where:
$y_i^x$ is the relative deviation of the oscillator frequency (e.g., the ratio of the deviation to nominal frequency $f_q$) in rotation around axis x in ppb, i.e., $y_i^x = 10^9 \cdot (f_i^x - f_q)/f_q$, wherein $f_i^x$ is the oscillator frequency estimate (associated with the quartz oscillator rotating around the x-axis) and $f_q$ is the nominal frequency of the oscillator;
$\phi^x(i \cdot T)$ are phase values calculated according to a scenario of rotations around the x-axis, y-axis, z-axis respectively;
$i = 1, 2, \ldots, N^x$ is the measurement number corresponding to rotation around the x-axis;
T is the measurement period;
$n_i^x$ is the discrete white Gaussian noise;
$B^x(i \cdot T)$ is the time-dependent term representing the constant shift and thermal frequency variation of the oscillator rotating around the x-axis; and
$C^x$, $S^x$ are the projections of orthogonal harmonic components of the oscillator's frequency onto the plane orthogonal to the rotation axis x.

To estimate integral g-sensitivity vector P, coefficients $C^x$, $S^x$ (the projections of orthogonal harmonic components from Equation set 4) have to be estimated. A wide range of estimators (e.g., data fitting and estimation models/methods) can be applied to solve the problem, e.g., the Least Squares Method (LSM), Kalman filter method, neural networking methods, regression methods, or other types of non-linear or heuristic estimators. Accordingly, coefficients $C^x$, $S^x$ are evaluated and their corresponding estimates $\hat{C}^x$, $\hat{S}^x$ are provided as outputs.

The term $B^x(i \cdot T)$ can also be modelled in various fashions as will be appreciated by those skilled in the art. As such, the $B^x(i \cdot T)$ representation also has an influence on the variability of specified estimate methods.

To estimate coefficients $C^x$, $S^x$ (from Equation set 4), approximate the term $B^x(i \cdot T)$ in the form of polynomial $$B^x(i \cdot T) = \sum_{k=0}^{d} a_k^x \cdot (i \cdot T)^k, \quad \text{(Equation 5)}$$

where:
d is the degree of the polynomial, and
$a_k^x$ are unknown coefficients to be estimated along with coefficients $C^x$, $S^x$.

So, Equation 4 will take the form:

$$y_i^x = C^x \cdot \cos(\phi^x(i \cdot T)) + S^x \cdot \sin(\phi^x(i \cdot T)) + \sum_{k=0}^{d} a_k^x \cdot (i \cdot T)^k + n_i^x. \quad \text{(Equation 6)}$$

To estimate unknown coefficients in Equation 6, compose the parameter vector in the form $$X^x = (C^x, S^x, a_0^x \ldots a_d^x)^T, \quad \text{(Equation 7)}$$

and estimate it (using LSM, for example) with reference to an observation vector $$Y^x = (y_1^x, y_2^x, \ldots, y_{N^x}^x)^T. \quad \text{(Equation 8)}$$

Using LSM for example, a solution for equal weights of measurements can be represented as:

$$\hat{X}^x = (D^x)^{-1} \cdot d^x = (\hat{C}^x, \hat{S}^x, \hat{a}_0^x, \ldots, \hat{a}_d^x)^T, \quad \text{(Equation 9)}$$

where $$D^x = \sum_{i=1}^{N^x} (h_i^x)^T \cdot h_i^x, \quad \text{(Equation 10)}$$

$$d^x = \sum_{i=1}^{N^x} (h_i^x)^T \cdot y_i^x, \text{ and} \quad \text{(Equation 11)}$$

$$h_i^x = [\cos(\phi^x(i \cdot T)), \sin(\phi^x(i \cdot T)), 1, (iT), (iT)^2 \ldots (iT)^d] \quad \text{(Equation 12)}$$

are rows of the coefficient matrix in the observation model/matrix, and $(h_i^x)^T$ are obtained from $h_i^x$ by transpose.

Thereafter, only estimates of the quadrature harmonic components, e.g., $\hat{C}^x$ and $\hat{S}^x$ are used. Similarly, estimates of quadrature components $\hat{C}^y$ and $\hat{S}^y$ are obtained in rotation around axis y and estimates of quadrature components $\hat{C}^z$ and $\hat{S}^z$ are obtained in rotation around axis z, in a similar manner as shown above, e.g., with appropriate substitution of the corresponding variables pertaining to the respective rotations around axes y and z.

The magnitude of the integral g-sensitivity vector P is then obtained based on the calculated estimates:

$$P = \quad \text{(Equation 13)}$$

$$|P| = \sqrt{\frac{1}{2}\left[(\hat{C}^x)^2 + (\hat{S}^x)^2 + (\hat{C}^y)^2 + (\hat{S}^y)^2 + (\hat{C}^z)^2 + (\hat{S}^z)^2\right]}$$

Projection estimates of the absolute value for g-sensitivity vector P on axes x, y, z can then be calculated according to the obtained results by using the following variables for these calculations:

$$A_x^2 = (\hat{C}^x)^2 + (\hat{S}^x)^2, \quad \text{(Equation 14)}$$

$$A_y^2 = (\hat{C}^y)^2 + (\hat{S}^y)^2, \text{ and} \quad \text{(Equation 15)}$$

$$A_z^2 = (\hat{C}^z)^2 + (\hat{S}^z)^2. \quad \text{(Equation 16)}$$

The magnitude of the integral g-sensitivity vector P (from Equation 13) can therefore be written as:

$$P = |P| = \sqrt{\frac{1}{2}(A_x^2 + A_y^2 + A_z^2)}. \quad \text{(Equation 17)}$$

Figure 6:
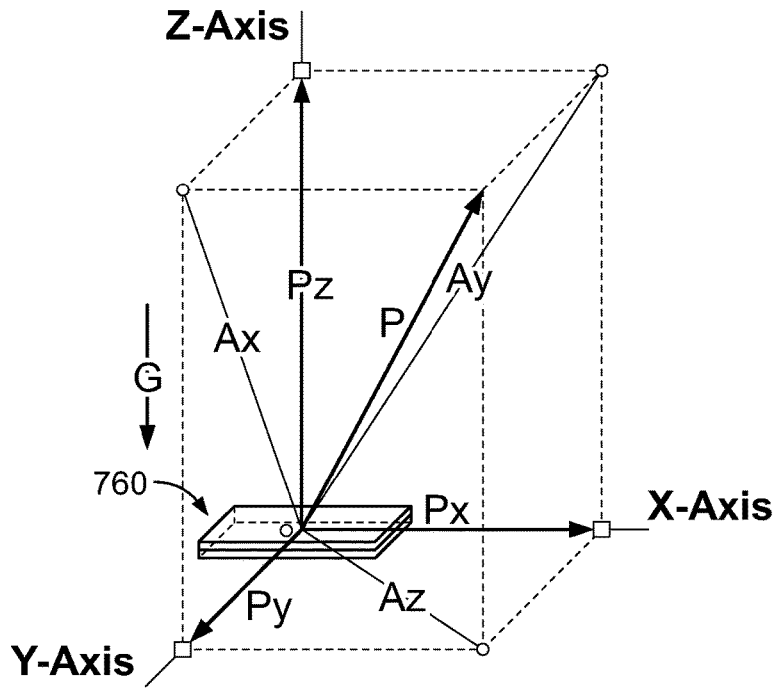
FIG. 6 shows a three-dimensional representation of a g-sensitivity vector according to an illustrative embodiment of the invention.

As shown in FIG. 6, values $A_x$, $A_y$ and $A_z$ are the projections of the integral g-sensitivity vector P for the quartz oscillator 760 (unit under test) onto planes YZ, XZ and XY, respectively, during rotation of the quartz oscillator.

The expression for g-sensitivity vector P can be written as follows:

$$P = \sqrt{\frac{1}{2}(A_x^2 + A_y^2 + A_z^2)}$$

and $$P = \sqrt{P_x^2 + P_y^2 + P_z^2}$$

Knowing $A_x$, $A_y$, and $A_z$, one can express projection estimates of the g-sensitivity vector P on axes x, y and z as follows:

$$\begin{aligned}
|P_x| &= \sqrt{(|P|^2 - A_x^2)_+} \\
|P_y| &= \sqrt{(|P|^2 - A_y^2)_+} \\
|P_z| &= \sqrt{(|P|^2 - A_z^2)_+}
\end{aligned} \quad \text{(Equation 18)}$$

where:

$$(a)_+ = \begin{cases} a, & \text{if } a > 0 \\ 0, & \text{otherwise} \end{cases}$$

for any real number a.

According to another aspect of the invention, signs of the projections $P_x$, $P_y$, $P_z$ of the integral g-sensitivity vector P on the x-axis, y-axis and z-axis, respectively, are obtained to derive actual values of the projections $P_x$, $P_y$, $P_z$. The signs can be obtained and evaluated in a number of ways. In one example, the signs can be obtained and evaluated by conducting successive 2g-tipover tests for each of the x-axis, y-axis and z-axis, respectively. The signs can also be obtained and evaluated via fixation of a rotation angle during each successive rotation of the quartz oscillator around the x-axis, y-axis and z-axis, respectively. In one example, the fixation of the rotation angle can be performed at the start of each successive rotation and, in another alternative example, the fixation of the rotation angle can be performed at the end of each successive rotation.

In this manner, the values of the projections $P_x$, $P_y$, $P_z$, can be derived as follows:

$$P_x = SN_x \cdot |P_x|;$$

$$P_y = SN_y \cdot |P_y|; \text{ and}$$

$$P_z = SN_z \cdot |P_z|,$$

where $SN_x$, $SN_y$, $SN_z$ correspond to the signs for the respective three orthogonal axes.

According to one illustrative embodiment noted above, rotations around the x-axis, y-axis, z-axis are performed at a substantially constant angular velocity, and rotation phases are represented as:

$$\phi^x(i \cdot T) = \phi^y(i \cdot T) = \phi^z(i \cdot T) = \omega_{rot} \cdot i \cdot T$$

wherein $\omega_{rot} = 2\pi \cdot f_{rot}$ is the angular velocity.

According to another embodiment, the quartz oscillator is affixed in position on a Global Navigation Satellite System (GNSS) receiver board for use in the aforementioned navigation applications. According to an aspect of the invention, the g-sensitivity of the quartz oscillator can be measured while mounted on the receiver board. In this example, all heterodyne frequencies of the GNSS receiver and time scale are generated using the frequency of the quartz oscillator. A signal from a stationary antenna is fed to the receiver and, once satellites are locked, antenna coordinates are determined. Additionally, clock offset relative to system time and its drift rate, commonly referred to as derivative offset (DO), are also determined. Relative frequency shift (relative deviation) of the oscillator (mounted on the GNSS receiver board), as it is rotated around the x-axis, y-axis and z-axis, respectively, can then be defined as:

$$y_i^x = 10^9 \cdot DO_i^x;$$

$$y_i^y = 10^9 \cdot DO_i^y; \text{ and}$$

$$y_i^z = 10^9 \cdot DO_i^z.$$

This inventive method and system provide a more robust, accurate and practical method for measuring g-sensitivity of quartz oscillators that are incorporated in high-precision systems, such as navigation receivers, which operate in environments that are subjected to vibrational effects and other mechanical forces.

As detailed above, the various embodiments herein can be embodied in the form of methods and a system for practicing those methods. The disclosed methods may be performed by a combination of hardware, software, firmware, middleware, and computer-readable medium (collectively "computer") installed in and/or communicatively connected to a user device.

Figure 7:
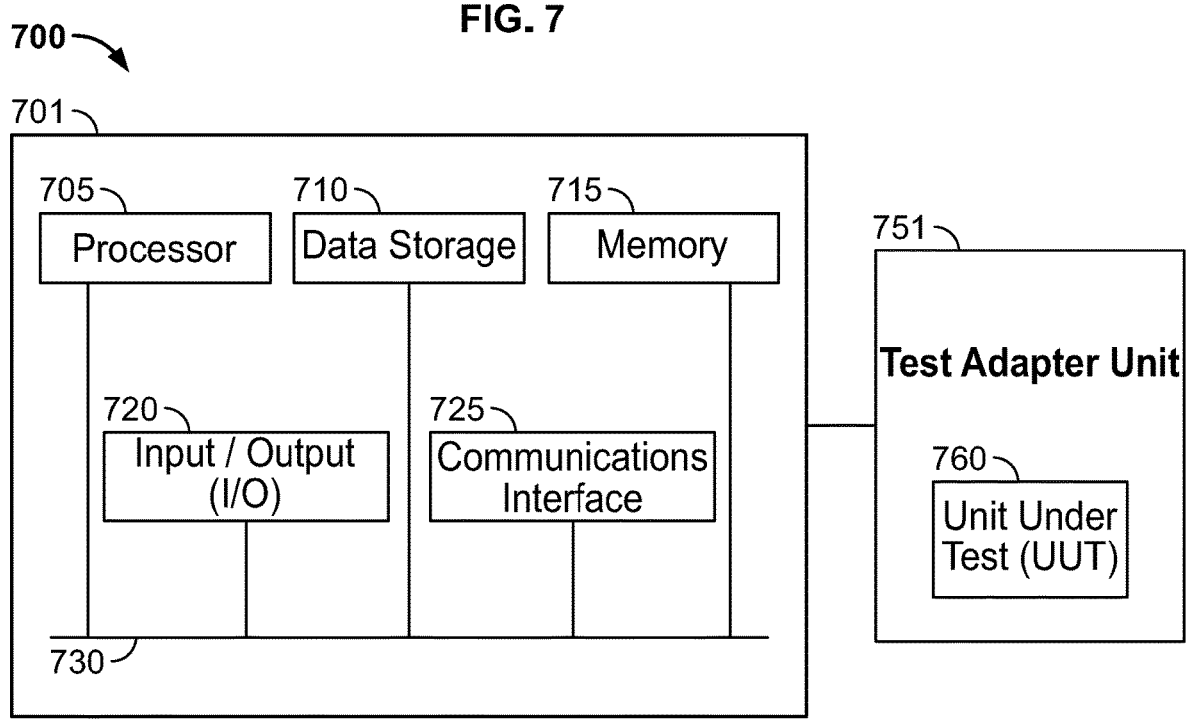
FIG. 7 shows a block diagram of a system according to an illustrative embodiment of the invention.

FIG. 7 is a high-level block diagram of an exemplary system 700 for carrying out the method in accordance with the various embodiments herein. In particular, system 700 may include computer 701 (which may function as a test server) connected or otherwise coupled to a test adapter unit 751, which is further connected or coupled to unit under test 760. By way of example, unit under test 760 may be a receiver board from a navigation receiver, wherein the receiver board includes a quartz oscillator. Computer 701 is shown to comprise a processor 705 operatively coupled to a data storage device 710 and a memory 715. Processor 705 controls the overall operation of computer 701 by executing computer program instructions that define such operations. Communications bus 730 facilitates the coupling and communication between the various components of computer 701. The computer program instructions may be stored in data storage device 710, or a non-transitory computer readable medium, and loaded into memory 715 when execution of the computer program instructions is desired. Thus, the steps of the disclosed method (see, FIG. 4 and the associated discussion herein above) can be defined by the computer program instructions stored in memory 715 and/or data storage device 710 and controlled by processor 705 executing the computer program instructions via a computer-readable medium. For example, the computer program instructions can be implemented as computer executable code programmed by one skilled in the art to perform the illustrative operations defined by the disclosed method. Accordingly, by executing the computer program instructions, processor 705 executes an algorithm defined by the disclosed method.

Processor 705 may include both general and special purpose microprocessors, and may be the sole processor or one of multiple processors of computer 701. Processor 705 may comprise one or more central processing units (CPUs), for example. Processor 705, data storage device 710 and/or memory 715 may include, be supplemented by, or incorporated in, one or more application-specific integrated circuits (ASICs) and/or one or more field programmable gate arrays (FPGAs).

Data storage device 710 and memory 715 each comprise a tangible non-transitory computer readable storage medium. Data storage device 710, and memory 715, may each include high-speed random access memory, such as dynamic random access memory (DRAM), static random access memory (SRAM), double data rate synchronous dynamic random access memory (DDR RAM), or other random access solid state memory devices, and may include non-volatile memory, such as one or more magnetic disk storage devices such as internal hard disks and removable disks, magneto-optical disk storage devices, optical disk storage devices, flash memory devices, semiconductor memory devices, such as erasable programmable read-only memory (EPROM), electrically erasable programmable read-only memory (EEPROM), compact disc read-only memory (CD-ROM), digital versatile disc read-only memory (DVD-ROM) disks, or other non-volatile solid state storage devices.

It should be noted that for clarity of explanation, the illustrative embodiments described herein may be presented as comprising individual functional blocks or combinations of functional blocks. The functions these blocks represent may be provided through the use of either dedicated or shared hardware, including, but not limited to, hardware capable of executing software. Illustrative embodiments may comprise digital signal processor ("DSP") hardware and/or software performing the operation described herein. Thus, for example, it will be appreciated by those skilled in the art that the block diagrams herein represent conceptual views of illustrative functions, operations and/or circuitry of the principles described in the various embodiments herein. Similarly, it will be appreciated that any flowcharts, flow diagrams, state transition diagrams, pseudo code, program code and the like represent various processes which may be substantially represented in computer readable medium and so executed by a computer, machine or processor, whether or not such computer, machine or processor is explicitly shown. One skilled in the art will recognize that an implementation of an actual computer or computer system may have other structures and may contain other components as well, and that a high level representation of some of the components of such a computer is for illustrative purposes.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

What is claimed is:

1. A method for estimating g-sensitivity of a quartz oscillator, comprising:
    rotating the quartz oscillator successively around each of a plurality of axes constituting a full-rank system;
    measuring a frequency of the quartz oscillator at a predetermined rate as a function of time during the rotating of the quartz oscillator; and
    estimating an integral g-sensitivity vector, during the rotating of the quartz oscillator, using a data fitting and estimation model and a plurality of frequency measurements obtained from the measuring of the frequency of the quartz oscillator.

2. The method of claim 1, wherein the data fitting and estimation model is one of a Least Squares Method (LSM), a Kalman filter, a neural networking method, a regression method, a heuristic estimator method, and a non-linear estimator method.

3. The method of claim 1, wherein the measuring is performed to derive a frequency estimate during the rotating of the quartz oscillator around each of the plurality of axes and to obtain a relative deviation of the frequency of the quartz oscillator, and wherein the plurality of axes comprises three orthogonal axes including an x-axis, a y-axis and a z-axis.

4. The method of claim 3, wherein the relative deviation of the frequency of the quartz oscillator is represented, in parts per billion (ppb) units, as $y_i^x = 10^9 \cdot (f_i^x - f_q)/f_q$, corresponding to rotation around the x-axis, $y_i^y = 10^9 \cdot (f_i^y - f_q)/f_q$, corresponding to rotation around the y-axis, and $y_i^z = 10^9 \cdot (f_i^z - f_q)/f_q$, corresponding to rotation around the z-axis, wherein
$f_i^x$, $f_i^y$ and $f_i^z$ are respective frequency estimates associated with the quartz oscillator rotating around the x-axis, y-axis and z-axis, respectively, and
$f_q$ is a nominal frequency of the quartz oscillator.

5. The method of claim 4, wherein the predetermined rate has a value of approximately greater than or equal to 10 Hz.

6. The method of claim 1, wherein the estimating of the integral g-sensitivity vector includes a parameter representing thermal frequency variations in the quartz oscillator.

7. The method of claim 1, wherein the plurality of axes comprises three orthogonal axes including an x-axis, a y-axis and a z-axis, and wherein the plurality of frequency measurements is represented as:

$y_i^x = C^x \cdot \cos(\phi^x(i \cdot T)) + S^x \cdot \sin(\phi^x(i \cdot T)) + B^x(i \cdot T) + n_i^x$, corresponding to rotation around the x-axis;

$y_i^y = C^y \cdot \cos(\phi^y(i \cdot T)) + S^y \cdot \sin(\phi^y(i \cdot T)) + B^y(i \cdot T) + n_i^y$, corresponding to rotation around the y-axis; and $y_i^z = C^z \cdot \cos(\phi^z(i \cdot T)) + S^z \cdot \sin(\phi^z(i \cdot T)) + B^z(i \cdot T) + n_i^z$, corresponding to rotation around the z-axis, wherein
$\phi^x(i \cdot T)$, $\phi^y(i \cdot T)$, $\phi^z(i \cdot T)$ are phase values calculated according to a scenario of rotations around the x-axis, y-axis, z-axis respectively,
i=1, 2, ..., $N^x$ is a measurement number corresponding to rotation around the x-axis,
i=1, 2, ..., $N^y$ is a measurement number corresponding to rotation around the y-axis,
i=1, 2, ..., $N^z$ is a measurement number corresponding to rotation around the z-axis,
T is a measurement period,
$n_i^x$, $n_i^y$, and $n_i^z$ are discrete white Gaussian noises corresponding to rotations around the x-axis, y-axis, z-axis respectively;
$y_i^x$, $y_i^y$, and $y_i^z$ are respective relative deviations of the frequency of the quartz oscillator rotating around the x-axis, y-axis and z-axis, respectively,
$B^x(i \cdot T)$, $B^y(i \cdot T)$ and $B^z(i \cdot T)$ are respective time-dependent terms that represent a constant shift and thermal frequency variation of the quartz oscillator rotating around the x-axis, y-axis and z-axis, respectively, and $C^x$ and $S^x$, $C^y$ and $S^y$, and $C^z$ and $S^z$ are respective pairs of projections of orthogonal harmonic components of the frequency of the quartz oscillator onto respective planes that are orthogonal to the x-axis, y-axis and z-axis, respectively, during rotation of the quartz oscillator.

8. The method of claim 7, wherein the projections $C^x$, $S^x$, $C^y$, $S^y$, $C^z$ and $S^z$ are estimated by the data fitting and estimation model, such that the projections $C^x$, $S^x$, $C^y$, $S^y$, $C^z$ and $S^z$ are evaluated and their corresponding estimates $\hat{C}^x$, $\hat{S}^x$, $\hat{C}^y$, $\hat{S}^y$, $\hat{C}^z$ and $\hat{S}^z$ are provided as outputs.

9. The method of claim 8, wherein the estimates $\hat{C}^x$, $\hat{S}^x$, $\hat{C}^y$, $\hat{S}^y$, $\hat{C}^z$, $\hat{S}^z$ are used to calculate squares of projections of the integral g-sensitivity vector, represented as $A_x^2, A_y^2, A_z^2$, onto planes YZ, XZ and XY which are orthogonal to the x-axis, y-axis and z-axis, respectively, during rotation of the quartz oscillator.

10. The method of claim 9, wherein the squares of the projections $A_x^2, A_y^2, A_z^2$ of the integral g-sensitivity vector are represented as:

$A_x^2 = (\hat{C}^x)^2 + (\hat{S}^x)^2$, $A_y^2 = (\hat{C}^y)^2 + (\hat{S}^y)^2$, and $A_z^2 = (\hat{C}^z)^2 + (\hat{S}^z)^2$.

and wherein the magnitude of the integral g-sensitivity vector is calculated as $$P = |P| = \sqrt{\frac{1}{2}(A_x^2 + A_y^2 + A_z^2)}.$$

11. The method of claim 10, wherein the integral g-sensitivity vector P includes projections $P_x$, $P_y$, $P_z$ on the x-axis, y-axis and z-axis, respectively, and wherein the absolute value of the projections $P_x$, $P_y$, $P_z$ are calculated as $$\left. \begin{array}{l} |P_x| = \sqrt{(|P|^2 - A_x^2)_+} \\ |P_y| = \sqrt{(|P|^2 - A_y^2)_+} \\ |P_z| = \sqrt{(|P|^2 - A_z^2)_+} \end{array} \right\},$$

wherein $$(a)_+ = \begin{cases} a, & \text{if } a > 0 \\ 0, & \text{otherwise} \end{cases}$$

for any real number a.

12. The method of claim 8, further comprising the step of applying a Least Squares Method (LSM) to:
obtain the estimates $\hat{C}^x$ and $\hat{S}^x$, corresponding to the rotation of the quartz oscillator around the x-axis;
obtain the estimates $\hat{C}^y$ and $\hat{S}^y$, corresponding to the rotation of the quartz oscillator around the y-axis; and
obtain the estimates $\hat{C}^z$ and $\hat{S}^z$, corresponding to the rotation of the quartz oscillator around the z-axis,
with the respective relative deviations of the frequency of the quartz oscillator represented by $$y_i^x = C^x \cdot \cos(\phi^x(i \cdot T)) + S^x \cdot \sin(\phi^x(i \cdot T)) + \sum_{k=0}^{d} a_k^x \cdot (i \cdot T)^k + n_i^x$$

$$y_i^y = C^y \cdot \cos(\phi^y(i \cdot T)) + S^y \cdot \sin(\phi^y(i \cdot T)) + \sum_{k=0}^{d} a_k^y \cdot (i \cdot T)^k + n_i^y$$

$$y_i^z = C^z \cdot \cos(\phi^z(i \cdot T)) + S^z \cdot \sin(\phi^z(i \cdot T)) + \sum_{k=0}^{d} a_k^z \cdot (i \cdot T)^k + n_i^z$$

wherein the terms $B^x$ ($i \cdot T$), $B^y$ ($i \cdot T$), and $B^z$ ($i \cdot T$) are approximated by polynomials, such that $$B^x(i \cdot T) = \sum_{k=0}^{d} a_k^x \cdot (i \cdot T)^k,$$

$$B^y(i \cdot T) = \sum_{k=0}^{d} a_k^y \cdot (i \cdot T)^k,$$

$$B^z(i \cdot T) = \sum_{k=0}^{d} a_k^z \cdot (i \cdot T)^k,$$

wherein
d is the degree of the polynomial, and
$a_k^x$ are unknown coefficients to be estimated along with the projections $C^x$, $S^x$, $C^y$, $S^y$, $C^z$ and $S^z$.

13. The method of claim 12, further comprising the step of, using LSM, estimating parameter vectors:

$$X^x = (C^x, S^x, a_0^x \ldots a_d^x)^T;$$

$$X^y = (C^y, S^y, a_0^y \ldots a_d^y)^T; \text{ and}$$

$$X^z = (C^z, S^z, a_0^z \ldots a_d^z)^T,$$

by respective observation vectors:

$$Y^x = (y_1^x, y_2^x, \ldots, y_{N^x}^x)^T;$$

$$Y^y = (y_1^y, y_2^y, \ldots, y_{N^y}^y)^T; \text{ and}$$

$$Y^z = (y_1^z, y_2^z, \ldots, y_{N^z}^z)^T,$$

wherein an LSM solution for equal weights of measurements is represented as $$X^x = (D^x)^{-1} \cdot d^x = (\hat{C}^x, \hat{S}^x, \hat{a}_0^x, \ldots, \hat{a}_d^x)^T,$$

$$X^y = (D^y)^{-1} \cdot d^y = (\hat{C}^y, \hat{S}^y, \hat{a}_0^y, \ldots, \hat{a}_d^y)^T$$

$$X^z = (D^z)^{-1} \cdot d^z = (\hat{C}^z, \hat{S}^z, \hat{a}_0^z, \ldots, \hat{a}_d^z)^T$$

wherein $$D^x = \sum_{i=1}^{N^x} (h_i^x)^T \cdot h_i^x,$$

$$D^y = \sum_{i=1}^{N^y} (h_i^y)^T \cdot h_i^y,$$

$$D^z = \sum_{i=1}^{N^z} (h_i^z)^T \cdot h_i^z,$$

$$d^x = \sum_{i=1}^{N^x} (h_i^x)^T \cdot y_i^x,$$

$$d^y = \sum_{i=1}^{N^y} (h_i^y)^T \cdot y_i^y,$$

$$d^z = \sum_{i=1}^{N^z} (h_i^z)^T \cdot y_i^z, \text{ and}$$

$$h_i^x = [\cos(\phi^x(i \cdot T)), \sin(\phi^x(i \cdot T)), 1, (iT), (iT)^2 \ldots (iT)^d]$$

$$h_i^y = [\cos(\phi^y(i \cdot T)), \sin(\phi^y(i \cdot T)), 1, (iT), (iT)^2 \ldots (iT)^d]$$

$$h_i^z = [\cos(\phi^z(i \cdot T)), \sin(\phi^z(i \cdot T)), 1, (iT), (iT)^2 \ldots (iT)^d]$$

are rows of a coefficient matrix in an observation model, and $(h_i^x)^T$, $(h_i^y)^T$, $(h_i^z)^T$ are obtained from $h_i^x$, $h_i^y$, $h_i^z$ by transpose respectively.

14. The method of claim 11, wherein signs $SN_x$, $SN_y$, $SN_z$ of the projections $P_x$, $P_y$, $P_z$ of the integral g-sensitivity vector P on the x-axis, y-axis and z-axis, respectively, are obtained to derive values of the projections $P_x$, $P_y$, $P_z$ according to:

$$P_x = SN_x \cdot |P_x|;$$

$$P_y = SN_y \cdot |P_y|; \text{ and}$$

$$P_z = SN_z \cdot |P_z|.$$

15. The method of claim 14, wherein the signs $SN_x$, $SN_y$, $SN_z$ are obtained and evaluated from successive 2g-tipover tests for each of the x-axis, y-axis and z-axis, respectively, where g represents acceleration of gravity.

16. The method of claim 14, wherein the signs $SN_x$, $SN_y$, $SN_z$ are obtained and evaluated by fixation of a rotation angle during each successive rotation of the quartz oscillator around the x-axis, y-axis and z-axis, respectively.

17. The method of claim 16, wherein the fixation of the rotation angle is performed at the start of each successive rotation.

18. The method of claim 16, wherein the fixation of the rotation angle is performed at the end of each successive rotation.

19. The method of claim 12, wherein rotations around the x-axis, y-axis and z-axis are performed at a substantially constant angular velocity, and the phase values are represented as:

$$\phi^x(i \cdot T) = \phi^y(i \cdot T) = \phi^z(i \cdot T) = \omega_{rot} \cdot i \cdot T,$$

wherein
$\omega_{rot} = 2\pi \cdot f_{rot}$ is angular velocity.

20. The method of claim 19, wherein the substantially constant angular velocity has a value in a range of approximately 0.3 to 1 turn per second.

21. The method of claim 1, wherein the quartz oscillator is fixed in position on a Global Navigation Satellite System (GNSS) receiver board for the measuring of the frequency of the quartz oscillator, further comprising the steps of:
at the GNSS receiver board, receiving and locking in on a signal from a stationary antenna to determine a derivative offset (DO) based on clock offset and drift rate; and
determining relative deviations of the frequency of the quartz oscillator, as the GNSS receiver board is rotated around an x-axis, y-axis and z-axis, respectively, wherein respective relative deviations are represented as $$y_i^x = 10^9 \cdot DO_i^x,$$

$$y_i^y = 10^9 \cdot DO_i^y, \text{ and}$$

$$y_i^z = 10^9 \cdot DO_i^z.$$

22. A system for estimating a-sensitivity of a quartz oscillator, the system comprising a processor, for executing computer program instructions stored in a memory, which when executed by the processor, cause the processor to perform operations comprising:
  in cooperation with a test adapter unit configured to receive the quartz oscillator for testing, rotating the quartz oscillator successively around each of a plurality of axes constituting a full-rank system;
  measuring a frequency of the quartz oscillator at a predetermined rate as a function of time during the rotating of the quartz oscillator; and
  estimating an integral g-sensitivity vector, during the rotating of the quartz oscillator, using a data fitting and estimation model and a plurality of frequency measurements obtained from the measuring of the frequency of the quartz oscillator.

23. The system of claim 22, wherein the measuring is performed to derive a frequency estimate during the rotating of the quartz oscillator around each of the plurality of axes and to obtain a relative deviation of the frequency of the quartz oscillator, and wherein the plurality of axes comprises three orthogonal axes including an x-axis, a y-axis and a z-axis.

24. The system of claim 23, wherein the relative deviation of the frequency of the quartz oscillator is represented, in parts per billion (ppb) units, as $$y_i^x = 10^9 \cdot (f_i^x - f_q)/f_q, \text{ corresponding to rotation around the } x\text{-axis},$$

$$y_i^y = 10^9 \cdot (f_i^y - f_q)/f_q, \text{ corresponding to rotation around the } y\text{-axis, and}$$

$$y_i^z = 10^9 \cdot (f_i^z - f_q)/f_q, \text{ corresponding to rotation around the } z\text{-axis},$$

wherein
  $f_i^x$, $f_i^y$ and $f_i^z$ are respective frequency estimates associated with the quartz oscillator rotating around the x-axis, y-axis and z-axis, respectively, and
  $f_q$ is a nominal frequency of the quartz oscillator.

25. The system of claim 22, wherein the plurality of axes comprises three orthogonal axes including an x-axis, a y-axis and a z-axis, and wherein the plurality of frequency measurements are represented as:

$$y_i^x = C^x \cdot \cos(\phi^x(i \cdot T)) + S^x \cdot \sin(\phi^x(i \cdot T)) + B^x(i \cdot T) + n_i^x, \text{ corresponding to rotation around the } x\text{-axis};$$

$$y_i^y = C^y \cdot \cos(\phi^y(i \cdot T)) + S^y \cdot \sin(\phi^y(i \cdot T)) + B^y(i \cdot T) + n_i^y, \text{ corresponding to rotation around the } y\text{-axis; and}$$

$$y_i^z = C^z \cdot \cos(\phi^z(i \cdot T)) + S^z \cdot \sin(\phi^z(i \cdot T)) + B^z(i \cdot T) + n_i^z, \text{ corresponding to rotation around the } z\text{-axis},$$

wherein
  $\phi^x(i \cdot T)$, $\phi^y(i \cdot T)$, $\phi^z(i \cdot T)$ are phase values calculated according to a scenario of rotations around the x-axis, y-axis, z-axis respectively,
  $i = 1, 2, \ldots, N^x$ is a measurement number corresponding to rotation around the x-axis,
  $i = 1, 2, \ldots, N^y$ is a measurement number corresponding to rotation around the y-axis,
  $i = 1, 2, \ldots, N^z$ is a measurement number corresponding to rotation around the z-axis, T is a measurement period,
  $n_i^x$, $n_i^y$, and $n_i^z$ are discrete white Gaussian noises corresponding to rotations around the x-axis, y-axis, z-axis respectively;
  $y_i^x$, $y_i^y$, and $y_i^z$ are respective relative deviations of the frequency of the quartz oscillator rotating around the x-axis, y-axis and z-axis, respectively,
  $B^x(i \cdot T)$, $B^y(i \cdot T)$ and $B^z(i \cdot T)$ are respective time-dependent terms that represent a constant shift and thermal frequency variation of the quartz oscillator rotating around the x-axis, y-axis and z-axis, respectively, and
  $C^x$ and $S^x$, $C^y$ and $S^y$, and $C^z$ and $S^z$ are respective pairs of projections of orthogonal harmonic components of the frequency of the quartz oscillator onto respective planes that are orthogonal to the x-axis, y-axis and z-axis, respectively, during rotation of the quartz oscillator.

26. The system of claim 25, wherein the projections $C^x$, $S^x$, $C^y$, $S^y$, $C^z$ and $S^z$ are estimated by the data fitting and estimation model, such that the projections $C^x$, $S^x$, $C^y$, $S^y$, $C^z$ and $S^z$ are evaluated and their corresponding estimates $\hat{C}^x$, $\hat{S}^x$, $\hat{C}^y$, $\hat{S}^y$, $\hat{C}^z$ and $\hat{S}^z$ are provided as outputs.

27. The system of claim 26, wherein the estimates $\hat{C}^x$, $\hat{S}^x$, $\hat{C}^y$, $\hat{S}^y$, $\hat{C}^z$, $\hat{S}^z$ are used to calculate squares of projections of the integral g-sensitivity vector, represented as $A_x^2, A_y^2, A_z^2$, onto planes YZ, XZ and XY which are orthogonal to the x-axis, y-axis and z-axis, respectively, during rotation of the quartz oscillator.

28. The system of claim 27, wherein the squares of the projections $A_x^2, A_y^2, A_z^2$ of the integral g-sensitivity vector are represented as:

$$A_x^2 = (\hat{C}^x)^2 + (\hat{S}^x)^2,$$

$$A_y^2 = (\hat{C}^y)^2 + (\hat{S}^y)^2, \text{ and}$$

$$A_z^2 = (\hat{C}^z)^2 + (\hat{S}^z)^2.$$

and wherein the magnitude of the integral g-sensitivity vector is calculated as $$P = |P| = \sqrt{\frac{1}{2}(A_x^2 + A_y^2 + A_z^2)}.$$

29. The system of claim 28, wherein the integral g-sensitivity vector P includes projections $P_x$, $P_y$, $P_z$ on the x-axis, y-axis and z-axis, respectively, and wherein the absolute value of the projections $P_x$, $P_y$, $P_z$ are calculated as $$\left. \begin{array}{l} |P_x| = \sqrt{(|P|^2 - A_x^2)_+} \\ |P_y| = \sqrt{(|P|^2 - A_y^2)_+} \\ |P_z| = \sqrt{(|P|^2 - A_z^2)_+} \end{array} \right\},$$

wherein $$(a)_+ = \begin{cases} a, & \text{if } a > 0 \\ 0, & \text{otherwise} \end{cases}$$

for any real number a.

30. The system of claim 22, wherein rotations around the x-axis, y-axis, z-axis are performed at a substantially constant angular velocity, and the substantially constant angular velocity has a value in a range of approximately 0.3 to 1 turns per second and the predetermined rate has a value of approximately greater than or equal to 10 Hz.

31. A non-transitory computer-readable medium storing computer program instructions for estimating g-sensitivity of a quartz oscillator, which, when executed on a processor, cause the processor to perform operations comprising:
    in cooperation with a test adapter unit configured to receive the quartz oscillator for testing, rotating the quartz oscillator successively around each of a plurality of axes constituting a full-rank system;
    measuring a frequency of the quartz oscillator at a predetermined rate as a function of time during the rotating of the quartz oscillator; and
    estimating an integral g-sensitivity vector, during the rotating of the quartz oscillator, using a data fitting and estimation model and a plurality of frequency measurements obtained from the measuring of the frequency of the quartz oscillator.

32. The non-transitory computer-readable medium of claim 31, wherein the measuring is performed to derive a frequency estimate during the rotating of the quartz oscillator around each of the plurality of axes and to obtain a relative deviation of the frequency of the quartz oscillator, and wherein the plurality of axes comprises three orthogonal axes including an x-axis, a y-axis and a z-axis.

* * * * *

UNITED STATES PATENT AND TRADEMARK OFFICE
CERTIFICATE OF CORRECTION

PATENT NO. : 10,879,908 B2  
APPLICATION NO. : 16/616591  
DATED : December 29, 2020  
INVENTOR(S) : Mark Isaakovich Zhodzishsky et al.

Page 1 of 1

It is certified that error appears in the above-identified patent and that said Letters Patent is hereby corrected as shown below:

In the Claims

Column 15, Claim 13, Lines 39-43, "
$Y^x = (y_1^x, y_2^x, \ldots, y_{N^x}^x)^T;$ $Y^y = (y_1^y, y_2^y, \ldots, y_{N^y}^y)^T;$ and $Y^z = (y_1^z, y_2^z, \ldots, y_{N^z}^z)^T,$
" should read --
$\mathbf{Y}^x = \left(y_1^x, y_2^x, \ldots, y_{N^x}^x\right)^T$ ;

$\mathbf{Y}^y = \left(y_1^y, y_2^y, \ldots, y_{N^y}^y\right)^T$ ; and $\mathbf{Y}^z = \left(y_1^z, y_2^z, \ldots, y_{N^z}^z\right)^T$
--.

Column 17, Claim 22, Line 6, "A system for estimating a-sensitivity of a quartz oscillator" should read --A system for estimating g-sensitivity of a quartz oscillator--.

Signed and Sealed this  
Sixteenth Day of February, 2021

Drew Hirshfeld  
*Performing the Functions and Duties of the*  
*Under Secretary of Commerce for Intellectual Property and*  
*Director of the United States Patent and Trademark Office*